United States Patent [19]

Kuo et al.

[11] Patent Number: 5,130,769
[45] Date of Patent: Jul. 14, 1992

[54] NONVOLATILE MEMORY CELL

[75] Inventors: Clinton C. K. Kuo; Ko-Min Chang, both of Austin, Tex.

[73] Assignee: Motorola, Inc., Schaumburg, Ill.

[21] Appl. No.: 700,837

[22] Filed: May 16, 1991

[51] Int. Cl.$^5$ .............................. H01L 29/68
[52] U.S. Cl. ...................... 357/23.5; 357/13; 357/55
[58] Field of Search .................... 357/23.5, 13, 55

[56] References Cited

U.S. PATENT DOCUMENTS

| | | | |
|---|---|---|---|
| 4,561,004 | 12/1985 | Kuo et al. | 357/23.5 |
| 4,765,473 | 8/1988 | Kuo | 357/23.5 |
| 4,957,877 | 9/1990 | Tam et al. | 437/43 |
| 4,958,321 | 9/1990 | Chang | 357/23.5 |
| 4,967,398 | 10/1990 | Yokoyama et al. | 365/185 |

OTHER PUBLICATIONS

A. Scheibe and Heinz Schulte, "Technology of a New N-Channel One-Transistor Earom Cell Called Simos" May 5, 1977.

Duane H. Oto et al., "High-Voltage Regulation and Process Considerations for High-Density 5V-Only E$^2$PROM's" Oct. 5, 1983.

*Primary Examiner*—Edward J. Wojciechowicz
*Attorney, Agent, or Firm*—Ray Warren; James L. Clingan, Jr.

[57] ABSTRACT

A floating gate is utilized which has two portions. A first portion overlies the channel region formed between the source and drain. The control gate overlies this portion of the floating gate and the remaining portion of the channel region forming an enhancement transistor. The second portion of the floating gate extends from the first portion over a thin oxide tunnel area of the source. An additional diode implant forming a junction with the drain region is provided to regulate the current flow through the drain, particularly during erasure.

14 Claims, 4 Drawing Sheets

NONVOLATILE MEMORY CELL

RELATED INVENTION

The present invention is related to the following invention which is assigned to the assignee of the present invention:

A Regulated Programming Circuit for a Nonvvolatile Memory, having Ser. No. 07/666,964, and filed on Mar. 11, 1991;

FIELD OF THE INVENTION

The present invention relates, in general, to memory cells and, more particularly, to nonvolatile memory cells.

BACKGROUND OF THE INVENTION

One particular type of nonvolatile memory cell is the Flash EEPROM (Electrically Erasable Programmable Read-Only Memory). Flash EEPROMs are a type of device which provides electrical erasing. The term "flash" refers to the ability to erase the memory cells simultaneously with electrical pulses. Typically, the erase operation erases the entire memory array (i.e. single transistors are not erased alone).

Known flash EEPROMs are typically programmed by using a cell structure which utilizes a programming voltage of approximately 10 to 15 volts connected to a control gate. These EEPROMs also use a drain voltage of approximately seven to nine volts. Under this operating condition, the conventional flash EEPROM implements a conventional hot carrier injection to raise the threshold voltage of all transistors being programmed.

One problem in the art of EEPROMs is that of over erasing the cell. If a cell is over erased, it will cause false results when aligned bits are read. For example, if a bit of word one is being read and the same bit of word two has been over erased, then current will flow through the transistor for the bit of word two resulting in a logic 0 reading regardless of the logic state of the bit of word one.

Two methods have been used to overcome this problem. The first is the use of an intelligent erase feature. Here, the system measures the total voltage of the array when programed with a logic 0 state (charged). A pulse erasing signal is then applied to the array and the the cells are checked again. This is repeated until none of the cells register a programed response following a pulsed erase signal. However, the problem here is that by the time the last cell is erased, the first cells may be entering an over erased state. This is compensated for by either making the voltage required to trigger the sense amp much higher, giving more room between a zero voltage level and the sense amp level, or requiring a much tighter control over processing so that there is little difference between those cells easily erased and those which require the most pulses. Neither of these options is particularly acceptable.

Another solution to this problem is the use of a series enhancement transistor. This transistor will act as a switch to block the current flow through a bit of a word that is not being accessed. While this helps solve the problem of obtaining erroneous results from over erased bits, it creates other problems of its own. For example, the cells must now be programmed and erased using the drain, as opposed to programing with the drain and erasing with the source. Since the ideal conditions for programming and erasing are some what different, this means that a compromise must be reached which would not be ideal for either function.

SUMMARY OF THE INVENTION

An advantage of the present invention is that it permits programming through the drain and erasing through the source while preventing the over erasing problem. A nonvolatile memory cell embodying the present invention comprises a floating gate having two portions. The first portion overlies the channel region formed between source and drain. Part of the control gate overlies the first portion of the floating gate and part overlies a remaining portion of the channel region. A second portion of the floating gate extends from the first portion to a thin oxide tunnel area of the source. The cell further comprises an additional implanted region below the floating gate in the source tunnelling area as well as an additional diode implant beneath the drain region.

DETAILED DESCRIPTION OF THE DRAWINGS

Figure 1:
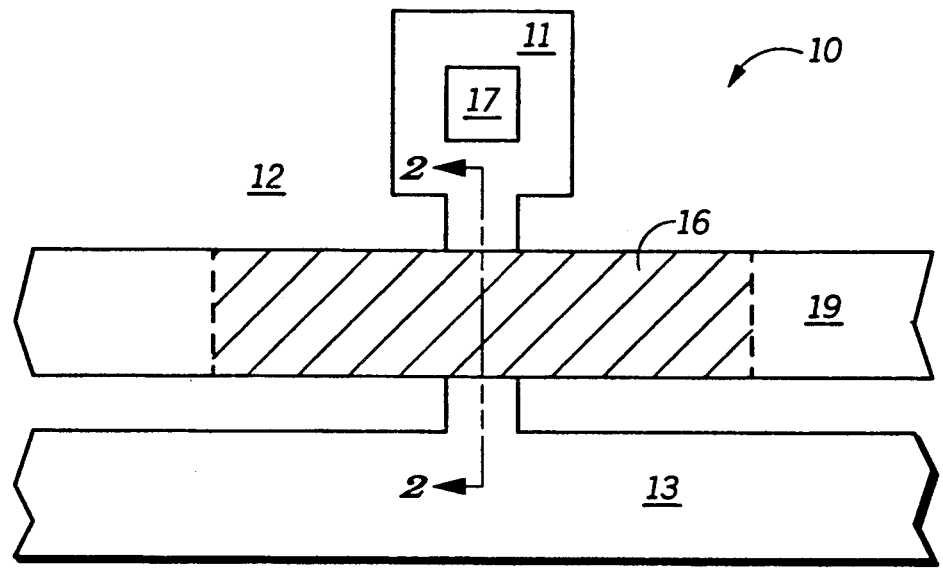
FIG. 1 is a prior art flash EEPROM cell with a floating gate disposed entirely between the control gate and the channel region.
Figure 2:
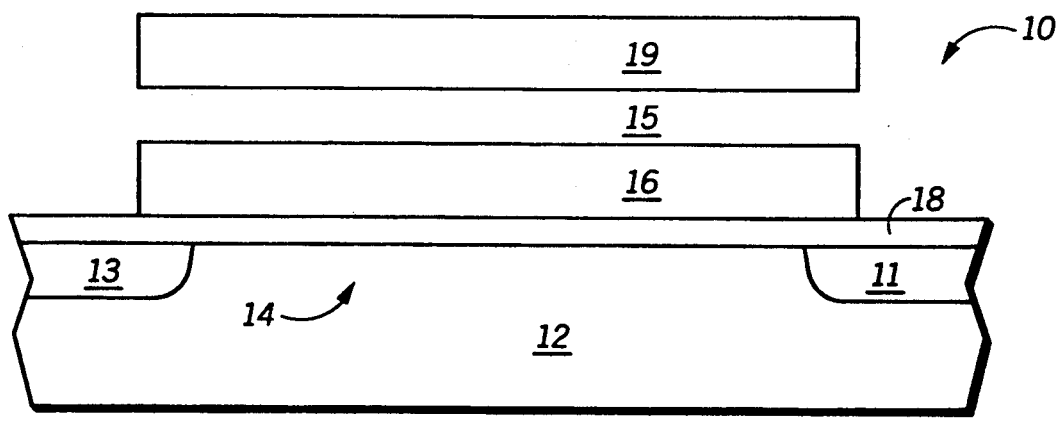
FIG. 2 is a cross-sectional view of a portion of the flash EEPROM cell of FIG. 1.

Referring initially to FIGS. 1 and 2, a prior art EEPROM cell, generally designated 10, is illustrated. Flash EEPROM 10 consists of a source region 13 and a drain region 11 formed in a substrate 12 and defining a channel region 14 therebetween. A contact 17 is shown coupled to drain 11.

Overlying channel region 14 is a floating gate 16 which is separated from substrate 12 by a dielectric 18. Overlying floating gate 16 is a control gate 19 which is separated from gate 16 by a second dielectric 15.

Cell 10 is the type of cell which is subject to the over erase problems. Erasing is accomplished by electron tunneling. A voltage of approximately 12 volts is applied to source 13 while gate 19 is grounded. The electrons trapped in gate 16 flow toward the cluster at the portion of the floating gate overlying the source region and tunnel from the floating gate to source 13 due to the high electric field across oxide 18. However, this process is not self limiting. Erasing usually leaves gate 16 positively charged due to the tunnelling out of not only the electrons used to program cell 10, but also some of the built-in background electrons, possibly changing the transistor to a depletion-mode transistor.

To avoid over erasing, "intelligent" erasing can be used as described above. Generally, this involves a series of erase and verify steps.

Figure 3:
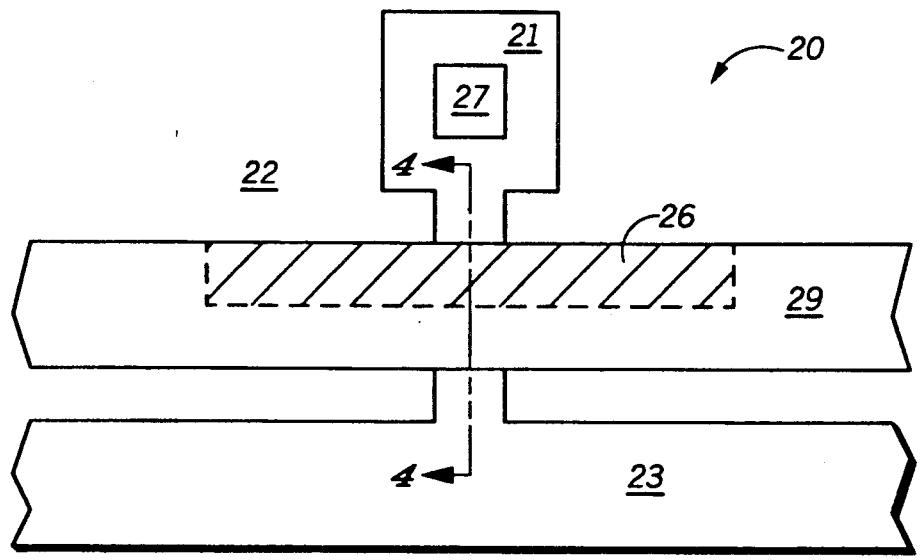
FIG. 3 is a prior art flash EEPROM cell with a two level control gate have the floating gate disposed between the upper level and the channel region.
Figure 4:
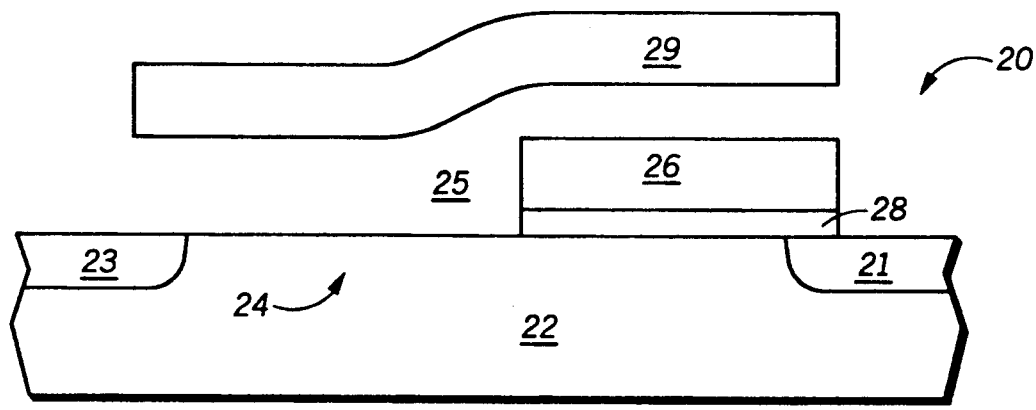
FIG. 4 is a cross-sectional view of a portion of the EEPROM cell of FIG. 3.

Referring now to FIGS. 3 and 4, a second prior art memory cell, generally designated 20, is illustrated. Cell 20 consists of a source region 23 and a drain region 21 formed in a substrate 22 and defining a channel region 24 therebetween. A contact 27 is shown coupled to drain 21.

Overlying a first portion of channel 24 is a floating gate 26 which is separated from substrate 22 by a dielectric 28. Overlying floating gate 26 and a second portion of channel 24 is a control gate 29. Control gate 29 is separated from gate 26 and substrate 22 by a second dielectric layer 25.

Figure 5:
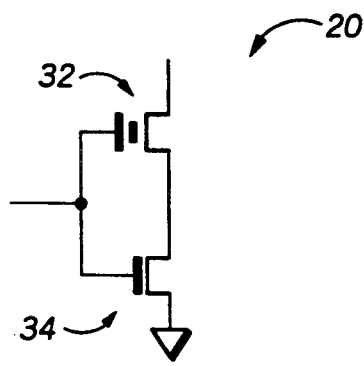
FIG. 5 is a schematic representation of the EEPROM cell of FIGS. 3 and 4.

The cell design of FIGS. 3 and 4 provides a device which is not subject to the errors which can be caused by over erasing the cell. As shown in the schematic representation of FIG. 5, cell 20 consists of a memory transistor 32 and an enhancement transistor 34. In this arrangement, memory transistor 32 may still be over erased. However, when cell 20 is not accessed, transistor 34 acts as a gate to prevent a current, which would provide a false reading, from passing through cell 20.

While cell 20 resolves the problem of over erase errors, it has the drawback of requiring that programming and erasing be conducted through drain 21. This is necessary since source 23 is not situated close enough to gate 26 to permit tunneling to occur.

Figure 6:
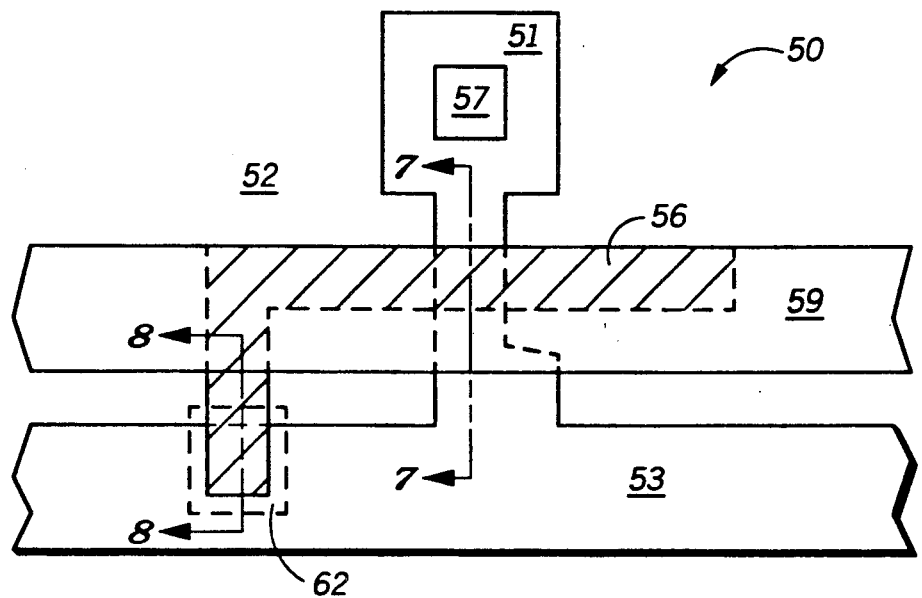
FIG. 6 is a self-aligned EEPROM cell embodying the present invention.
Figure 7:
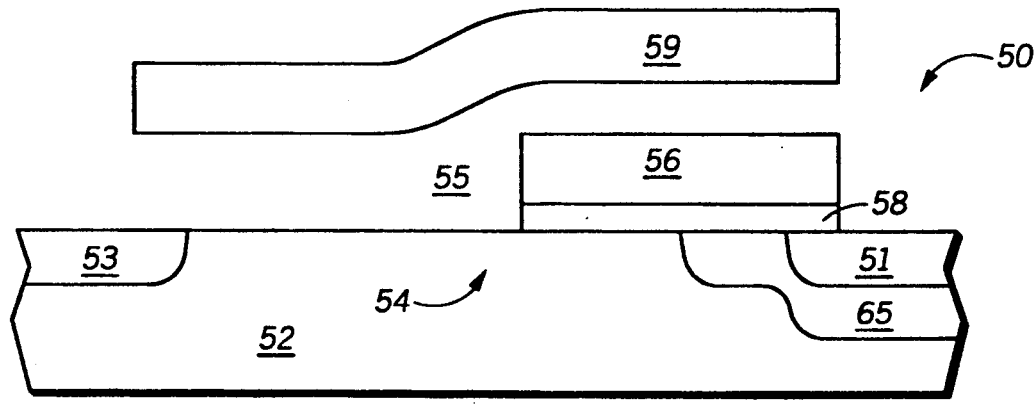
FIGS. 7 and 8 are cross sectional views of the EEPROM cell of FIG. 6.
Figure 8:
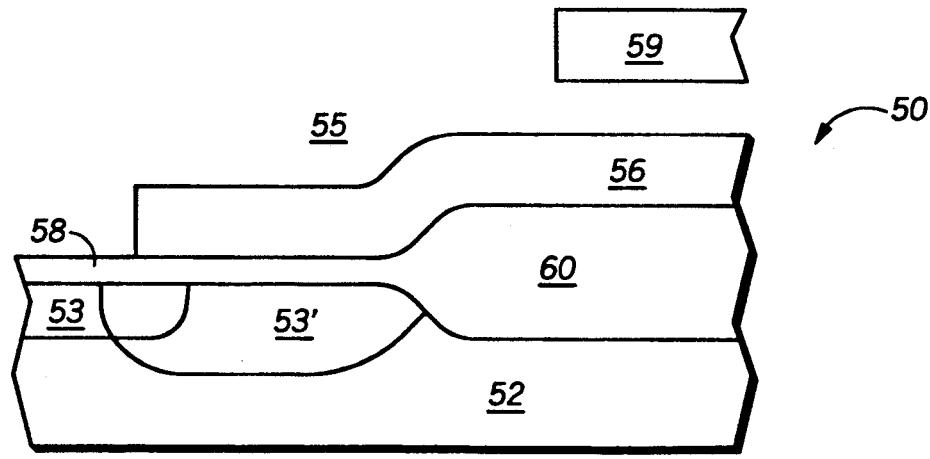

In FIGS. 6-8, a flash EEPROM cell, generally designated 50, embodying the present invention is illustrated. Cell 50 consists primarily of a drain 51, source 53, floating gate 56, control gate 59, and a diode implant 65. As shown in FIG. 7, these elements are laid out primarily as in FIG. 4 (except for diode implant region 65) with gate 56 overlying a portion of channel 54 and is separated therefrom by dielectric layer 58. Gate 59 is then disposed over the remaining portion of channel 54 and over gate 56, being separated from the channel and gate 56 by dielectric 55.

One difference between cell 50 and cell 10 is the extension of floating gate 56 over a thin oxide tunnel area 62 above source 53. A cross sectional view of this portion of cell 50, FIG. 8, shows that floating gate 56 extends over a portion of source 53. Source 53 being illustrated here as two portions, 53 and 53'. In one particular embodiment, source 53 would be an N+ type while 53' would be an N type, with substrate 52 being a P− type material.

This permits the device to be erased using the source as opposed to the drain, as required in the device of FIG. 3. This also permits the drain and source to be configured to allow the optimum conditions for programing and erasing, respectively. This optimization in turn allows for faster programing and erase times.

In FIG. 7, a cross-sectional view of EEPROM 50 along line 7—7 of FIG. 6 is illustrated. FIG. 7 illustrates an additional implant (diode) region 65. In one preferred embodiment, implant 65 is a Boron diffused area forming a P type region within P− substrate 52. This implant region forms a zener diode at the interface with drain 51. This diode provides a drain voltage clamping mechanism to reduce the $V_{PP}$ sensitivity on drain disturb.

Figure 9:
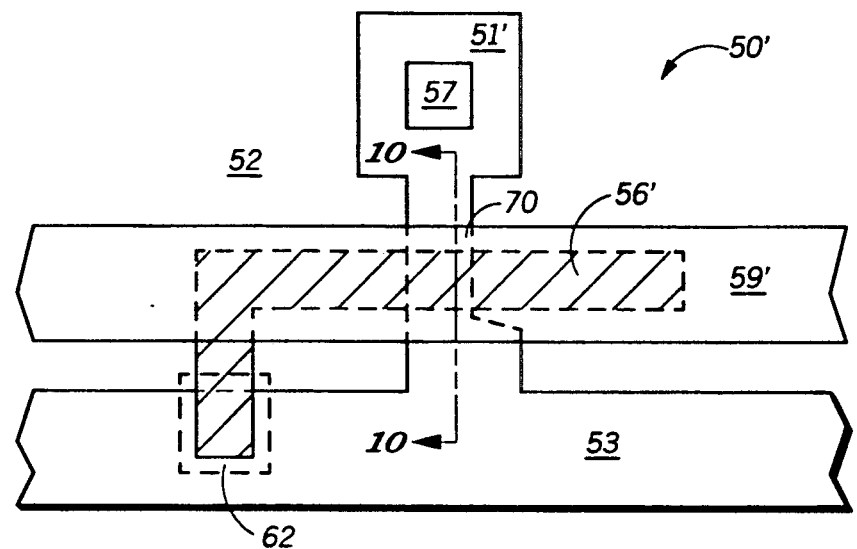
FIG. 9 is a non-self-aligned EEPROM cell embodying the present invention.
Figure 10:
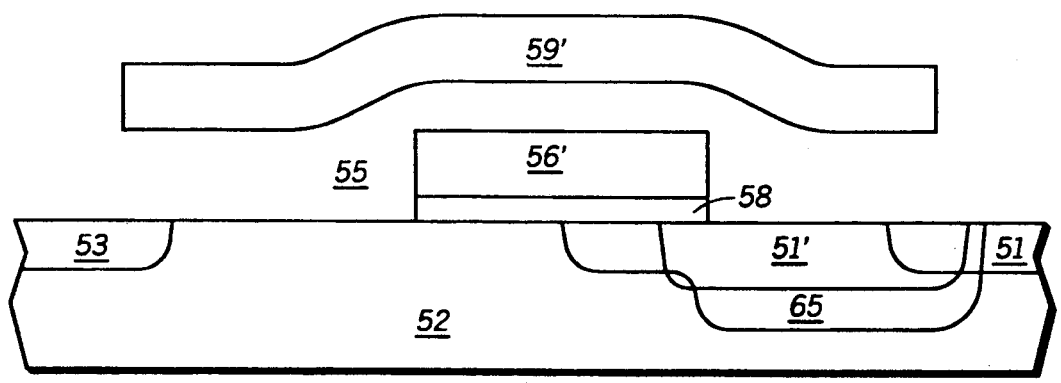
FIG. 10 is a cross sectional view of the EEPROM cell of FIG. 9.

In FIGS. 9 and 10 a second embodiment of the present invention illustrating a non-self-aligned EEPROM cell is illustrated. As can be seen in FIG. 9, the edge of floating gate 56' is not aligned with the edge of control gate 59'. This would result in an unwanted transistor being formed at area 70 where control gate 59' directly overlies drain 51. This transistor is unwanted because it introduces undesirable resistance when programming.

To eliminate the extra transistor, the drain region is divided into two portions, 51 and 51'. In a specific embodiment, using a p type substrate, region 51 would be an n+ type while region 51' would be an N− type. This results in the extra transistor being shunted and the circuit would function the same as cell 50, FIG. 6.

Therefore, an EEPROM is provided in which programming is achieved through hot-electron injection on the drain side and erasure is achieved through Fowler-Nordheim tunnelling on the source side. An implanted N region below the floating gate in the source tunnelling region area reduces the total erase current by eliminating the band-to-band tunnelling of electrons. The over erase problem is eliminated by the incorporation of a split gate on the source side which maintains the memory cell in enhancement mode even when the floating gate region is driven into depletion.

Thus, it will be apparent to one skilled in the art, upon reviewing the foregoing description, that there has been provided in accordance with the invention, a device that fully satisfies the aims and advantages.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A nonvolatile memory cell having a substrate of a first concentration of a first conductivity type, said nonvolatile memory cell comprising:

a drain region of a second conductivity type disposed in said substrate, said drain region having a first area of a first concentration and a second area of a second concentration;

a source region of said second conductivity type disposed in said substrate, said source region having a first area of said first concentration and a second area of said second concentration and said source region being spaced from said drain region to define a channel region therebetween, said channel region having a first portion having a first length and a second portion having a second length, said second length greater than said first length;

a diode implant of a first concentration of said first conductivity type disposed in said substrate forming a junction with said drain region;

a floating gate having a first portion juxtaposed to said channel region and a second portion extending from said first portion to said first area of said source region, said first portion of said floating gate overlying the first portion of said channel region;

a first dielectric disposed between a first portion of said substrate and said floating gate;

a control gate having a first portion overlying said floating gate and a second portion overlying said second portion of said channel region; and a second dielectric disposed between said floating gate and said first portion of said control gate and between said second portion of said channel region and said second portion of said control gate.

2. The nonvolatile memory cell of claim 1 wherein said first conductivity type is a P type and said second conductivity type is an N type.

3. The nonvolatile memory cell of claim 2 wherein said first concentration of said second conductivity type is an N+ material and said second concentration of said first conductivity is an N material.

4. The nonvolatile memory cell of claim 1 wherein said first dielectric is an oxide material.

5. The nonvolatile memory cell of claim 1 wherein said second dielectric comprises:
   a first oxide layer;
   a nitride layer disposed on said first oxide layer; and
   a second oxide layer disposed on said nitride layer.

6. A nonvolatile memory cell having a substrate of a first conductivity type, comprising:
   a drain region of a second conductivity type disposed in said substrate;
   a source region of a second conductivity type disposed in said substrate,
      said source region having a first area of a first concentration and a second area of a second concentration and said source region being spaced from said drain region to define a channel region therebetween, said channel region having a first portion having a first length and a second portion having a second length, said second length greater than said first length;
   a diode implant of a first concentration of said first conductivity type disposed in said substrate forming a junction with said drain region;
   a floating gate having a first portion juxtaposed to said channel region and a second portion extending from said first portion and overlying said first area of said source region, said first portion of said floating gate overlying the first portion of said channel region;
   a first dielectric disposed between a first portion of said substrate and said floating gate;
   a control gate having a first portion overlying said floating gate and a second portion overlying said second portion of said channel region; and
   a second dielectric disposed between said floating gate and said first portion of said control gate and between said second portion of said channel region and said second portion of said control gate.

7. The nonvolatile memory cell of claim 6 wherein said first conductivity type is a P type and said second conductivity type is an N type.

8. The nonvolatile memory cell of claim 7 wherein said first concentration of said first conductivity type is an N+ material and said second concentration of said first conductivity is an N material.

9. The nonvolatile memory cell of claim 6 wherein said first dielectric is an oxide material.

10. The nonvolatile memory cell of claim 6 wherein said second dielectric comprises:
    a first oxide layer;
    a nitride layer disposed on said first oxide layer; and
    a second oxide layer disposed on said nitride layer.

11. An EEPROM cell comprising:
    a semiconductor body predominantly of a first conductivity;
    source and drain regions in said body at a first face thereof, said source and drain regions being of a second conductivity type, said source region being disposed generally along a first line and said drain region being spaced from said source region along a second line approximately perpendicular to said first line;
    regulating means for regulating the flow of electron-hole pairs from said semiconductor body into said drain region, said regulating means being disposed in said semiconductor body and forming a junction with said drain region;
    a channel region in said body at said first face thereof separating said source and drain regions, said channel region being of said first conductivity type, and having a first portion having a first length and a second portion having a second length, said second length greater than said first length;
    a floating gate formed of patterned conductive material overlying and isolated from said body, said floating gate overlying said first portion of said channel region and a portion of said source region;
    tunnel oxide means for selectivity providing a tunnelling path between said floating gate and said source, said tunnel oxide means being in a position removed from said second line; and
    a control gate formed of patterned conductive material overlying and isolated from said floating gate and said body, said control gate and said floating gate being co-extensive over said first portion of said channel region and over said tunnel oxide means.

12. The EEPROM cell of claim 11 wherein said tunnel oxide means further comprises a first layer of oxide separating said source region and said floating gate.

13. The EEPROM cell of claim 11 wherein said junction formed at by said regulating means and said drain region comprises a diode.

14. The EEPROM cell of claim 13 wherein said diode comprises a zener diode.

* * * * *